(12) United States Patent
Schell et al.

(10) Patent No.: US 8,217,379 B2
(45) Date of Patent: Jul. 10, 2012

(54) ARSENIC-CONTAINING VARIABLE RESISTANCE MATERIALS

(75) Inventors: Carl Schell, Waterford, MI (US); Guy Wicker, Southfield, MI (US); Jon Maimon, Manassas, VA (US)

(73) Assignee: Ovonyx, Inc., Sterling Heights, MI (US)

( * ) Notice: Subject to any disclaimer, the term of this patent is extended or adjusted under 35 U.S.C. 154(b) by 103 days.

(21) Appl. No.: 12/505,854

(22) Filed: Jul. 20, 2009

(65) Prior Publication Data

US 2011/0012080 A1  Jan. 20, 2011

(51) Int. Cl.
*H01L 29/02* (2006.01)
(52) U.S. Cl. ........................ 257/2; 257/616; 257/E27.12
(58) Field of Classification Search ............ 257/2, 616, 257/E27.12
See application file for complete search history.

(56) References Cited

U.S. PATENT DOCUMENTS

| | | | |
|---|---|---|---|
| 2006/0221555 A1* | 10/2006 | Pinnow | 361/525 |
| 2007/0034850 A1* | 2/2007 | Kostylev et al. | 257/4 |
| 2007/0133384 A1* | 6/2007 | Kondo | 369/275.4 |

* cited by examiner

*Primary Examiner* — Wensing Kuo
(74) *Attorney, Agent, or Firm* — Kevin L. Bray (57) ABSTRACT

A variable resistance material for memory applications. The material includes a base Ge—Sb—Te composition and further includes As-doping. The materials were included in variable resistance memory devices. Incorporation of As in the variable resistance composition led to a significant increase in the operational life of the device and, unexpectedly, did not reduce the programming speed of the device. In one embodiment, the composition includes at atomic concentration of Ge in the range from 7%-13%, an atomic concentration of Sb in the range from 50%-70%, an atomic concentration of Te in the range from 20%-30%, and an atomic concentration of As in the range from 2%-15%.

27 Claims, 7 Drawing Sheets

ARSENIC-CONTAINING VARIABLE RESISTANCE MATERIALS

FIELD OF INVENTION

This invention relates to variable resistance materials. More particularly, this invention relates to alloy compositions for variable resistance memory materials. Most particularly, this invention relates to arsenic-doped phase-change memory materials.

BACKGROUND OF THE INVENTION

Variable resistance materials are promising active materials for next-generation electronic storage and computing devices. A variable resistance material possesses two or more states that differ in electrical resistance and can be programmed back and forth between the states by providing energy to induce an internal chemical, electronic, or physical transformation of the material that manifests itself as a change in resistance of the material. The different resistance states can be associated with different data values and used as memory states to store or process data.

Phase change materials are a promising class of variable resistance materials. A phase change material is a material that is capable of undergoing a transformation, preferably reversible, between two or more distinct structural states. The distinct structural states may be distinguished on the basis of, for example, crystal structure, atomic arrangement, order or disorder, fractional crystallinity, relative proportions of two or more different structural states, or a physical (e.g. electrical, optical, magnetic, mechanical) or chemical property. In a common embodiment, the two or more distinct structural states include differing proportions of crystalline phase regions and amorphous phase regions of the phase change material, where the phase-change material is reversibly transformable between the different states. In the crystalline state, the phase change material has lower resistivity; while in the amorphous state, it has higher resistivity. Continuous variations in resistivity over a wide range can be achieved through control of the relative proportions of crystalline phase regions and amorphous phase regions in a volume of phase-change material. Reversibility of the transformations between structural states permits reuse of the material over multiple cycles of operation.

Typically, a variable resistance device is fabricated by placing the active variable resistance material, such as a phase change material, between two electrodes. Operation of the device is effected by providing an electrical signal between the two electrodes and across the active material. In a common application, phase-change materials may be used as the active material of a memory device, where distinct data values are associated with the different structural states and each data value corresponds to a distinct resistance of the phase-change material. The different structural states employed in memory operation may also be referred to herein as memory states or resistance states of the phase-change material. Write operations in a phase-change memory device, which may also be referred to herein as programming operations, apply electric pulses to the phase-change material to alter its structural state to a state having the resistance associated with the intended data value. Read operations are performed by providing current or voltage signals across the two electrodes to measure the resistance. The energy of the read signal is sufficiently low to prevent disturbance of the structural state of the phase-change material.

In order to expand the commercial opportunities for phase-change memory, it is desirable to identify new phase-change compositions, device structures, and methods of programming that lead to improved performance. A key performance metric for phase-change memory is cycle life, which is a measure of the number of times the device can be reversibly programmed between memory states. Over the course of operation, a memory device undergoes multiple read and write cycles. In a binary memory device, the write cycles entail repeated transformations between two memory states. In a multilevel memory device, the write cycles entail repeated transformations between three or more memory states. In practice, the number of cycles of operation of a phase-change memory device is limited and after a certain number of cycles, the device fails. Various failure modes have been identified for phase-change memory devices including open circuit failure, short circuit failure, stuck set failure, and stuck reset failure.

Factors that may contribute to device failure include the phase-change alloy composition, electrode materials, interface contamination, and volatilization. The phase-change alloy composition is relevant because the constituent elements of many phase-change materials are capable of forming multiple stoichiometric compositions or multiple crystallographic structures. This tendency promotes the creation or stabilization of multiple stoichiometric or crystallographic phases during cycling. As a result, the repeated heating and cooling steps required for programming a phase-change material may induce phase segregation and/or a progressive evolution of the phase-change material to a less effective or non-functional structural or compositional state.

The choice of electrode material influences cycle life through the quality of the contact formed with the phase-change material. Consistent performance of the device over many cycles requires good adhesion of the electrodes to the phase-change material. The electrode material must be matched to the phase-change composition to achieve good adhesion. Poor adhesion may lead to delamination of the electrode from the phase-change material, which may lead to an open circuit condition.

Interface contamination can contribute to device failure by promoting phase segregation or the formation of non-functional phases. Oxygen, for example, is a common contaminant in device fabrication and is known to form stable insulator phases with elements, such as Ge, that are commonly present in phase-change compositions. The formation of oxides from the constituent elements of a phase-change composition may be promoted by the high temperature conditions associated with device programming. As a result, the composition of the phase-change alloy may evolve over time and transform to a non-functional state. The creation of a thick oxide layer at the electrode interface, for example, may prevent programming.

The high temperature conditions associated with programming may also promote volatilization of the phase-change material. Programming of a phase-change material to an amorphous state entails providing sufficient current to heat the phase-change material to its melting temperature. While in a molten phase, the phase-change material may experience evaporation. Similarly, sublimation may occur in a solid phase-change material upon heating. Since different elements of a phase-change material tend to evaporate or sublime at different rates, escape of elements due to volatilization alters the composition of the phase-change material. This effect is cumulative upon cycling. In addition to altering phase-change composition, the loss of material that accompanies volatilization creates a void in the working region of the device that impair electrical contact with the electrodes. As a result, delamination or open circuit failure become more likely.

There is a need in the art to develop phase-change materials that exhibit long cycle life. To be commercially successful, phase-change devices need to exhibit stable performance over prolonged time periods and multiple operating cycles. For many commercial applications, a phase-change memory device needs to perform for at least $10^6$ cycles without failing. Ideally, it would be desirable to develop phase-change memory devices that are consistently stable over at least $10^9$ operating cycles.

SUMMARY OF THE INVENTION

This invention provides variable resistance materials that prolong the cycle life of variable resistance memory devices. The variable resistance compositions include a chalcogen element, one or more modifying elements and As (arsenic). In one embodiment, the variable resistance composition includes Te (tellurium) and As. In another embodiment, the variable resistance composition includes Te, Sb (antimony), and As. In a further embodiment, the variable resistance composition includes Te, Sb, As, and Ge.

In one embodiment, the variable resistance material is a phase-change material having a plurality of resistance states distinguished on the basis of structure. The resistance states may include a crystalline state, an amorphous state, and/or a series of mixed crystalline-amorphous states where the resistivity correlates with the relative proportion of crystalline and amorphous phase content and where the material can be reversibly transformed among the different structural states through energetic programming. In one embodiment, the energetic programming is electrical programming that utilizes electrical current or voltage pulses to influence the structural state of a phase-change or other variable resistance material.

One group of variable resistance compositions includes an atomic concentration of Sb of 50-75%, an atomic concentration of Te of 15-35%, and As. In one embodiment, the atomic concentration of As is 2-15%. In another embodiment, the atomic concentration of As is 5-10%. Any of these compositions may further include Ge. In one embodiment, the atomic concentration of Ge is 5-15%. In another embodiment, the atomic concentration of Ge is 7-12%. In a further embodiment, the atomic concentration of Ge is 9-11%.

A second group of variable resistance compositions includes an atomic concentration of Sb of 50-75%, an atomic concentration of Te of 22-28%, and As. In one embodiment, the atomic concentration of As is 2-15%. In another embodiment, the atomic concentration of As is 5-10%. Any of these compositions may further include Ge. In one embodiment, the atomic concentration of Ge is 5-15%. In another embodiment, the atomic concentration of Ge is 7-12%. In a further embodiment, the atomic concentration of Ge is 9-11%.

A third group of variable resistance compositions includes an atomic concentration of Sb of 55-65%, an atomic concentration of Te of 15-35%, and As. In one embodiment, the atomic concentration of As is 2-15%. In another embodiment, the atomic concentration of As is 5-10%. Any of these compositions may further include Ge. In one embodiment, the atomic concentration of Ge is 5-15%. In another embodiment, the atomic concentration of Ge is 7-12%. In a further embodiment, the atomic concentration of Ge is 9-11%.

A fourth group of variable resistance compositions includes an atomic concentration of Sb of 55-65%, an atomic concentration of Te of 22-28%, and As. In one embodiment, the atomic concentration of As is 2-15%. In another embodiment, the atomic concentration of As is 5-10%. Any of these compositions may further include Ge. In one embodiment, the atomic concentration of Ge is 5-15%. In another embodiment, the atomic concentration of Ge is 7-12%. In a further embodiment, the atomic concentration of Ge is 9-11%.

Variable resistance memory devices incorporating the instant As-containing chalcogenide compositions exhibit extended operational cycle life relative to similar phase-change materials lacking As. As-doping of chalcogenide compositions may also reduce the set speed of phase-change memory devices relative to set speeds observed for similar phase-change materials lacking As.

DETAILED DESCRIPTION OF THE ILLUSTRATED EMBODIMENTS

Although this invention will be described in terms of certain preferred embodiments, other embodiments that are apparent to those of ordinary skill in the art, including embodiments that do not provide all of the benefits and features set forth herein, are also within the scope of this invention. Accordingly, the scope of the invention is defined only by reference to the appended claims.

This invention provides variable resistance memory materials that when incorporated as the active material of a memory device, extend cycle life. The success of variable resistance memory devices in many commercial applications depends on the operational life of the device. Over time, a memory device will undergo multiple cycles of reading and writing and must provide consistent performance without failing. In this invention, a series of variable resistance memory material compositions that promotes the cycle life of memory devices is described. The discussion that follows emphasizes phase-change materials as illustrative variable resistance materials. The general principles set forth herein, however, apply to variable resistance materials generally that operate through the action of an energetic input that induces transformations between two or more states distinguishable on the basis of resistance.

In order to appreciate the benefits of the instant invention, it is helpful to review the basic operational characteristics of phase-change memory devices. The following discussion focuses on chalcogenide materials as illustrative phase-change materials. The basic principles apply equally to other forms of phase-change or state-change materials, such as pnictides or other classes of materials transformable between two or more states distinguishable on the basis of structure, a physical property or a chemical property.

An important feature of the operation of chalcogenide-based phase-change memory devices and arrays is the ability of the chalcogenide memory material to undergo a phase transformation between or among two or more structural states. The chalcogenide memory materials have structural states that include a crystalline state, one or more partially-crystalline states and an amorphous state. The crystalline state may be a single crystal state or a polycrystalline state. The amorphous state may be a glassy state, vitreous state, or other state lacking long range structural order. A partially-crystalline state refers to a structural state in which a volume of chalcogenide or phase-change material includes an amorphous portion and a crystalline portion. Generally, a plurality of partially-crystalline states exists for the chalcogenide or phase-change material, where different partially-crystalline states may be distinguished on the basis of the relative proportion of amorphous and crystalline regions. Fractional crystallinity is one way to characterize the structural states of a chalcogenide phase-change material. The fractional crystallinity of the crystalline state is 100%, the fractional crystallinity of the amorphous state is 0%, and the fractional crystallinities of the partially-crystalline states may vary continuously between 0% (the amorphous limit) and 100% (the crystalline limit). Phase-change chalcogenide materials are thus generally able to transform among a plurality of structural states that may vary inclusively between fractional crystallinities of 0% and 100%.

Transformations among the structural states are induced by providing energy to the chalcogenide memory material. Energy in various forms can induce structural transformations of the crystalline and amorphous portions to alter the fractional crystallinity of a chalcogenide memory material. Suitable forms of energy include one or more of electrical energy, thermal energy, optical energy or other forms of energy (e.g. particle-beam energy) that induce electrical, thermal or optical effects in a chalcogenide memory material. Continuous and reversible variability of the fractional crystallinity is achievable by controlling the energy environment of a chalcogenide memory material. A crystalline state can be transformed to a partially-crystalline or an amorphous state, a partially-crystalline state can be transformed to a crystalline, amorphous or different partially-crystalline state, and an amorphous state can be transformed to a partially-crystalline or crystalline state through proper control of the energy environment of a chalcogenide memory material. Some considerations associated with the use of thermal, electrical and optical energy to induce structural transformations are presented in the following discussion.

The use of thermal energy to induce structural transformations exploits the thermodynamics and kinetics associated with the crystalline to amorphous or amorphous to crystalline phase transitions. An amorphous phase may be formed, for example, from a partially-crystalline or crystalline state by heating a chalcogenide material above its melting temperature and cooling at a rate sufficient to inhibit the formation of crystalline phases. A crystalline phase may be formed from an amorphous or partially-crystalline state, for example, by heating a chalcogenide material above the crystallization temperature for a sufficient period of time to effect nucleation and/or growth of crystalline domains. The crystallization temperature is below the melting temperature and corresponds to the minimum temperature at which crystallization may occur. The driving force for crystallization is typically thermodynamic in that the free energy of a crystalline or partially-crystalline state in many chalcogenide memory materials is lower than the free energy of an amorphous state so that the overall energy of a chalcogenide memory material decreases as the fractional crystallinity increases. Formation (nucleation and growth) of a crystalline state or crystalline domains within a partially-crystalline or amorphous state is kinetically enabled above the crystallization temperature, so that heating above the crystallization temperature promotes crystallization by providing energy that facilitates the rearrangements of atoms needed to form a crystalline phase or domain. The fractional crystallinity of a partially-crystalline state can be controlled by controlling the temperature or time of heating or by controlling the temperature or rate of cooling. Through proper control of the peak temperature, time of heating and rate of cooling, structural states over a wide range of fractional crystallinity can be achieved for the chalcogenide phase-change materials.

The use of electrical energy to induce structural transformations relies on the application of electrical (current or voltage) pulses to a chalcogenide memory material. The mechanism of electrically-induced structural transformations is based on the Joule heating created by resistance of the material and/or neighboring resistive electrodes to current flow. Joule heating corresponds to a conversion of electrical energy to thermal energy and leads to an increase in the temperature of the chalcogenide material. By controlling the current density, the temperature can be increased to above the crystallization temperature, between the crystallization temperature and melting temperature, or above the melting temperature.

Figure 1:
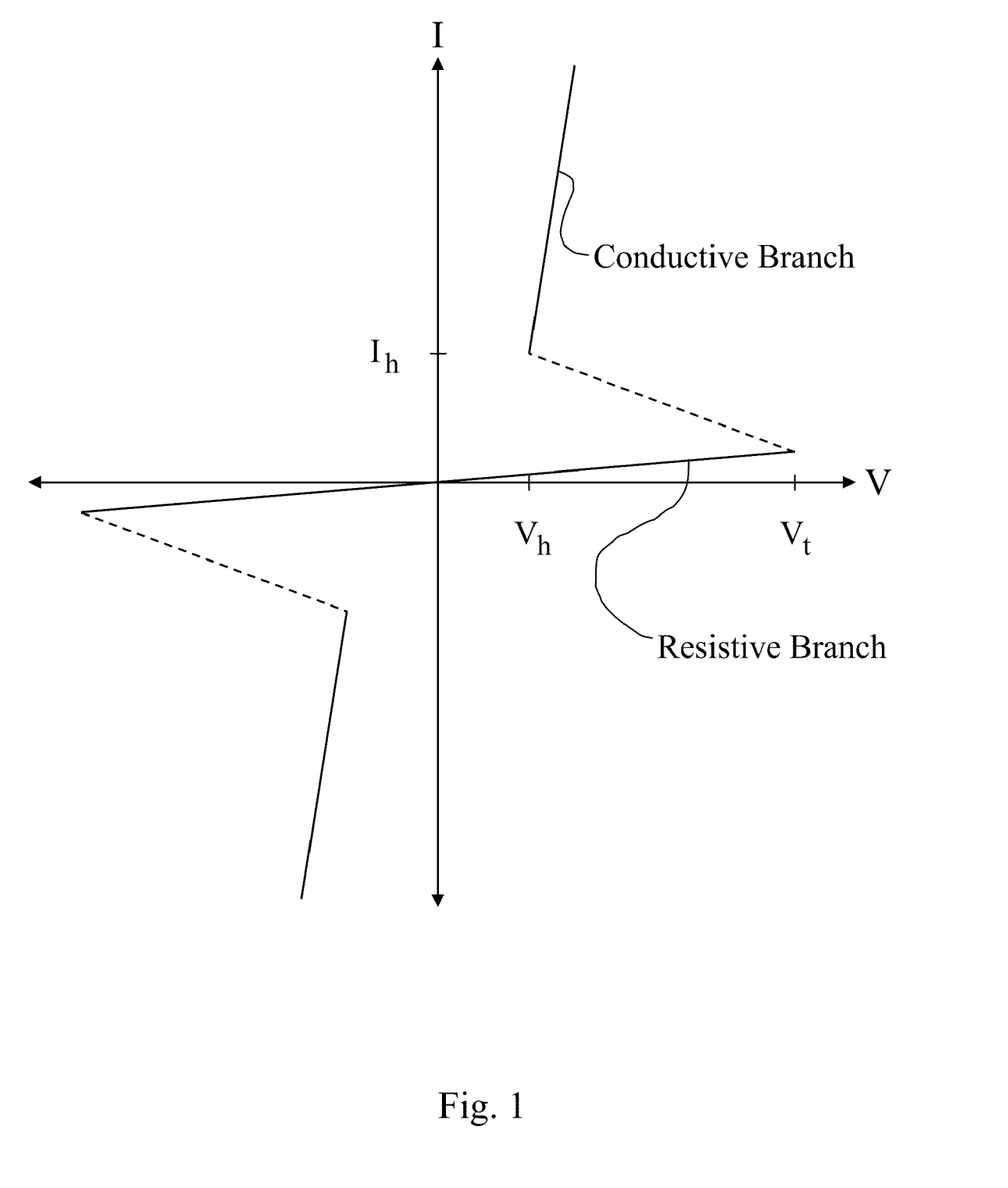
FIG. 1 is a depiction of the I-V characteristics of a chalcogenide material that exhibits an electrical switching transformation from a resistive state to a conductive state.

The crystalline phase portions of a chalcogenide memory material are sufficiently conductive to permit current densities that provide adequate Joule heating. The amorphous phase portions, however, are much less conductive and ordinarily would not support current densities sufficient to heat the material to the crystallization temperature or melting temperature. It turns out, however, that the amorphous phase of chalcogenide memory materials can be electrically switched to a highly conductive "dynamic" state upon application of a voltage greater than the threshold voltage as shown in FIG. 1. In the dynamic state, an amorphous phase region of a chalcogenide phase-change material can support a current density that is high enough to heat the material to or above the crystallization or melting temperature through Joule heating. As a result, nucleation and/or growth of a crystalline phase can be induced in an amorphous phase region. (For more information on electrical switching in chalcogenide materials see U.S. Pat. No. 6,967,344 entitled "Multi-Terminal Chalcogenide Switching Devices".) By controlling the magnitude and/or duration of electrical pulses applied to a chalcogenide phase-change material, it is possible to continuously vary the fractional crystallinity through controlled interconversion of the crystalline and amorphous phases.

Joule heating produced in layers adjacent to the phase-change material may facilitate structural transformations. In many device designs, for example, resistive heaters in electrical communication with a phase-change material are located in close proximity to the phase-change material. The passage of current through a resistive heater produces thermal energy in the environment of the phase-change material that may be used to drive or aid structural transformations during programming.

The effect of electrical stimulation on a chalcogenide memory material is generally depicted in terms of the R-I (resistance-current) relationship of the material. The R-I relationship shows the variation of the programmed electrical resistance of a chalcogenide memory material as a function of the amount of electrical energy provided or as a function of the magnitude of the current or voltage pulse applied to a chalcogenide memory material. The R-I response is a convenient representation of the effect of crystalline-amorphous structural transformations on electrical resistance. A brief discussion of the R-I characteristics of chalcogenide memory materials follows.

Figure 2:
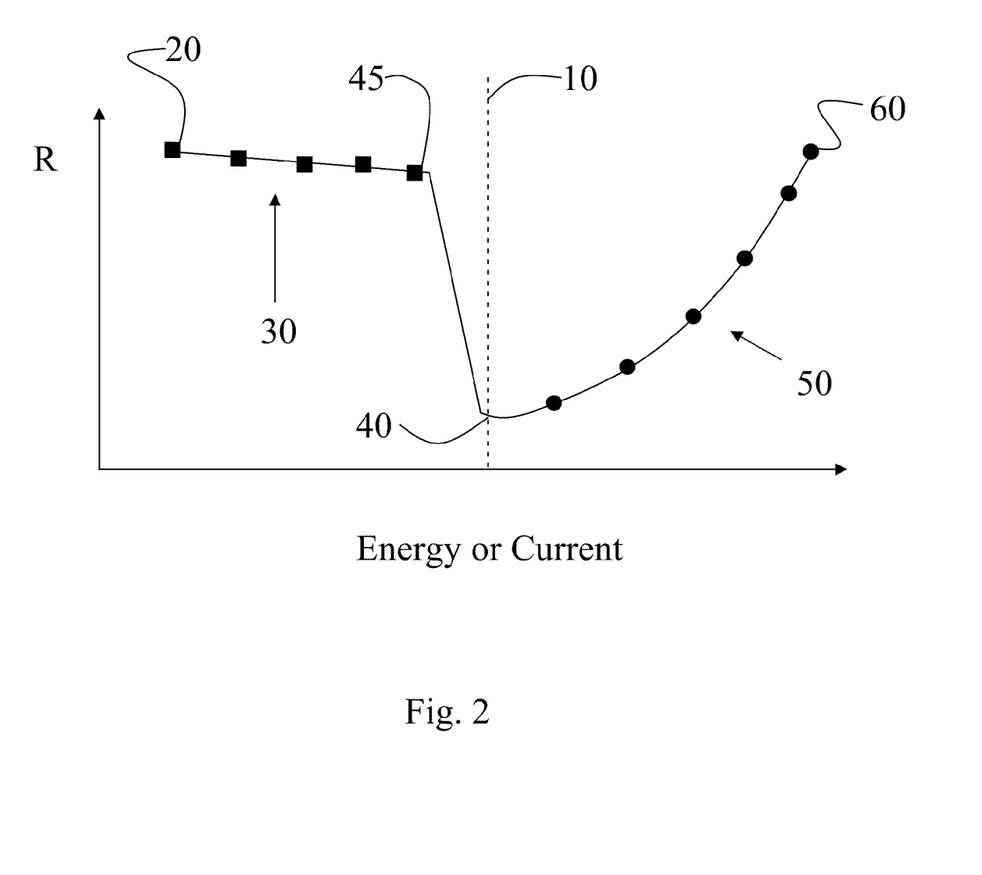
FIG. 2 is an illustrative Resistance vs. Energy/Current plot for a chalcogenide phase-change material.

A representative depiction of the electrical resistance (Resistance) of a chalcogenide memory material as a function of electrical energy or current pulse magnitude (Energy/Current) is presented in the resistance plot shown in FIG. 2. The resistance plot includes two characteristic response regimes of a chalcogenide memory material to electrical energy. The regimes are approximately demarcated with the vertical dashed line 10 shown in FIG. 2. The regime to the left of the line 10 may be referred to as the accumulating regime of the memory material. The accumulation regime is distinguished by a nearly constant or gradually varying electrical resistance with increasing electrical energy that culminates in an abrupt decrease in resistance at a critical energy (which may be referred to herein as the set energy). The accumulation regime thus extends, in the direction of increasing energy, from the leftmost point 20 of the resistance plot, through a plateau region (generally depicted by 30) corresponding to the range of points over which the resistance variation is small or gradual to the set point or state 40 that follows an abrupt decrease in electrical resistance. Plateau 30 may be horizontal or sloping.

The left side of the resistance plot is referred to as the accumulating regime because the structural state of the chalcogenide material cumulatively evolves as energy is applied. More specifically, the fractional crystallinity of the structural state increases with the total applied energy so that the material "accumulates" crystalline phase content in this regime. The leftmost point 20 corresponds to the structural state in the accumulating regime having the lowest fractional crystallinity and may be referred to as the reset state. This state may be fully amorphous or may be primarily amorphous with some degree of crystalline content. As energy is added, the chalcogenide material progresses among a plurality of partially-crystalline states with increasing fractional crystallinity along plateau 30 as crystalline phase regions accumulate in the material. Selected accumulation states (structural states in the accumulation region) are marked with squares in FIG. 2.

Upon accumulation of a sufficient amount of crystalline phase content, the fractional crystallinity of the chalcogenide memory material increases sufficiently to effect a setting transformation. The setting transformation is characterized by a dramatic decrease in electrical resistance and culminates in stabilization of set state 40. The structural states in the accumulation regime may be referred to as accumulation states of the chalcogenide memory material. Structural transformations in the accumulating regime are unidirectional in that they progress in the direction of increasing applied energy within plateau region 30 and are reversible only by first driving the chalcogenide material through the set point 40 and the reset point 60, resetting the device. Once the reset state is obtained, lower amplitude current pulses can be applied and the accumulation response of the chalcogenide material can be restored.

The addition of energy to a chalcogenide material in the accumulating regime is believed to lead to an increase in fractional crystallinity through the formation of new crystalline domains, growth of existing crystalline domains or a combination thereof. It is believed that the electrical resistance varies only gradually along plateau 30 despite the increase in fractional crystallinity because the crystalline domains form or grow in relative isolation of each other so as to prevent the formation of a contiguous crystalline network that spans the chalcogenide material between the two electrodes of the memory device. This type of crystallization may be referred to herein as sub-percolation crystallization.

In one model, the setting transformation coincides with a percolation event in which a contiguous, interconnected crystalline network forms within the chalcogenide material, where the network bridges the space between the two electrodes of the device. Such a network may form, for example, when crystalline domains increase sufficiently in size to impinge upon neighboring domains. Since the crystalline phase of chalcogenide materials is more conductive than the amorphous phase, the percolation event corresponds to the formation of a contiguous conductive pathway between the top and bottom electrodes through the chalcogenide material. As a result, the percolation event is marked by a dramatic decrease in the resistance of the chalcogenide material, where the resistance of the material following the percolation event depends to a large extent on the effective cross-sectional area of the percolation path. The leftmost point 20 of the accumulation regime may be an amorphous state or a partially-crystalline state lacking a contiguous crystalline network. Sub-percolation crystallization commences with an initial amorphous or partially-crystalline state and progresses through a plurality of partially-crystalline states having increasingly higher fractional crystallinities until the percolation threshold is reached and the setting transformation occurs.

The regime to the right of the line 10 of FIG. 2 may be referred to as the direct overwrite regime. The direct overwrite regime extends from set state 40 through a plurality of intermediate states (generally depicted by 50) to a reset point or state 60. The various points in the direct overwrite regime may be referred to as direct overwrite states of the chalcogenide memory material. Selected direct overwrite states are marked with circles in FIG. 2. Structural transformations in the direct overwrite regime may be induced by applying an electric current or voltage pulse to a chalcogenide material.

In the direct overwrite regime, the resistance of the chalcogenide memory material varies with the magnitude of the applied electric pulse. The resistance of a particular direct overwrite state is characteristic of the structural state of the chalcogenide memory material, and the structural state is dictated by the magnitude of the applied current pulse. The fractional crystallinity of the chalcogenide memory material decreases as the magnitude of the current pulse increases. The fractional crystallinity is highest for direct overwrite states at or near set point 40 and progressively decreases as reset state 60 is approached. The chalcogenide memory material transforms from a structural state possessing a contiguous crystalline network at set state 40 to a structural state that is amorphous, substantially amorphous or partially-crystalline without a contiguous crystalline network at reset state 60. The application of current pulses having increasing magnitude has the effect of converting portions of the crystalline network into an amorphous phase and ultimately leads to a disruption or interruption of contiguous high-conductivity crystalline pathways in the chalcogenide memory material. As a result, the resistance of the chalcogenide memory material increases with increasing applied current in the direct overwrite region.

In contrast to the accumulating region, structural transformations in the direct overwrite region are reversible and bi-directional. As indicated hereinabove, each state in the direct overwrite region may be identified by its resistance and an associated current pulse magnitude, where application of the associated current pulse magnitude induces changes in fractional crystallinity that produce the particular resistance state. Application of a subsequent current pulse may increase or decrease the fractional crystallinity of an existing resistance state of the chalcogenide memory material. If the subsequent current pulse has a higher magnitude than the pulse used to establish the existing state, the fractional crystallinity of the chalcogenide memory material decreases and the structural state is transformed from the existing state in the direction of the reset state along the direct overwrite resistance curve. Similarly, if the subsequent current pulse has a lower magnitude than the pulse used to establish the existing state, the fractional crystallinity of the chalcogenide memory material increases and the structural state is transformed from the existing state in the direction of the set state along the direct overwrite resistance curve.

The direct overwrite states of the chalcogenide memory material may be used to define memory states of a memory device. Most commonly, the memory devices are binary memory devices that utilize two of the direct overwrite states as memory states, where a distinct data value (e.g. "0" or "1") is associated with each state. Each binary memory state corresponds to a distinct structural state of the chalcogenide material. Readout or identification of the state can be accomplished by measuring the resistance of the material (or device) since each structural state is characterized by a distinct resistance value. The operation of transforming a chalcogenide memory material to the structural state associated with a particular memory state may be referred to herein as programming the chalcogenide memory material, writing to the chalcogenide memory material or storing information in the chalcogenide memory material. The resistance of the memory state established by programming the chalcogenide memory material may also be referred to herein as the programmed resistivity of the material or programmed resistance of the device.

To facilitate readout and minimize reading errors, it is desirable to select the memory states of a binary memory device so that the contrast in resistance of the two states is large. Typically the set state (or a state near the set state) and the reset state (or a state near the reset state) are selected as memory states in a binary memory application. The resistance contrast depends on details such as the chemical composition of the chalcogenide, the thickness of the chalcogenide material in the device and the geometry of the device. For a layer of phase-change material having the composition $Ge_{22}Sb_{22}Te_{56}$, a thickness of ~600 Å, and pore diameter of below ~0.1 µm in a typical two-terminal device geometry, for example, the resistance of the reset state is ~100-1000 kΩ and the resistance of the set state is under ~10 kΩ. Phase-change devices in general show resistances in the range of ~100 kΩ to ~1000 kΩ in the reset state and resistance of ~0.5 kΩ to ~50 kΩ in the set state. In the preferred phase-change devices, the resistance of the reset state is at least a factor of two, and more typically an order of magnitude or more, greater than the resistance of the set state.

An important practical requirement for variable resistance memory devices is the ability of the device to perform reliably and reproducibly over multiple cycles of operation. The longevity of variable resistance memory devices is controlled by the consistency of resistance values upon application of programming pulses having a particular set of pulse energy characteristics (e.g. pulse duration, pulse shape, pulse amplitude). When a particular programming pulse is applied in the direct overwrite memory region, it is necessary for the resistance of the device to transform to its expected value and for this value to occur reproducibly over the full operational life of the device.

A common mode of failure of phase-change memory devices occurs when resistance values are no longer reproducibly established as expected upon application of a particular programming pulse. In binary operation, for example, it is common to cycle between the set state and reset state. The set state is programmed with a set pulse and the reset state is programmed with a reset pulse. The set pulse is commonly a relatively low amplitude, long duration pulse and the reset pulse is commonly a relatively high amplitude, short duration pulse. (For background information on pulse attributes needed to program and read phase-change memory devices see, for example, U.S. Pat. No. 6,570,784 to Lowrey, the disclosure of which is hereby incorporated herein in its entirety.) In some instances after repeated cycles of operation, the device fails because the set pulse is no longer capable of transforming the phase-change material to its set state. The device instead remains in its reset state despite being subjected to a programming pulse. This mode of failure is sometimes referred to as a "stuck reset condition" or "stuck reset failure". In other instances after repeated cycles of operation, the device fails because the reset pulse is no longer capable of transforming the phase-change material to its reset state. Instead, the device remains in its set state despite being subjected to a programming pulse. This mode of failure is sometimes referred to as a "stuck set condition" or "stuck set failure". In still other instances, device failure is the result of delamination of the phase-change material from an electrical contact or volatilization of the phase-change material from the working region of the device. These conditions lead to the formation of gaps or voids in the working region of the device and are responsible for an "open circuit" mode of failure.

One factor that is believed to contribute to stuck set and stuck reset failure is electromigration. Electromigration is an electric field induced segregation of the constituents of a phase-change or other variable resistance composition. Device programming typically involves the application of an electrical programming pulse between the electrodes of a variable resistance device. One of the electrodes becomes positive relative to the other and an electric field is established across the active variable resistance material. The electric field makes portions of the variable resistance material adjacent to the positive device electrode electropositive relative to the portions of the variable resistance material adjacent to the negative device electrode. The electric field thus provides a driving force for segregating the different elemental constituents of a variable resistance material on the basis of electronegativity. Relatively electronegative constituents will be induced by the electric field to migrate toward the more electropositive regions of the variable resistance material, while relatively electropositive constituents will be induced by the electric field to migrate toward the more electronegative regions of the variable resistance material. The tendency for constituents to segregate is greatest when the variable resistance material is heated because heating increases the mobility of constituents. Constituent mobility is generally highest in molten or liquid states, but may still be appreciable in crystalline or amorphous phases upon heating. The migration effect is cumulative over the operational cycles of the device.

Since the electronegativity of different constituents of a variable resistance material generally differ, the driving force provided by the electric field differs for different constituents and differential migration of constituents occurs. Differential migration of constituents effects a segregation of constituents and may lead to a gradient in the composition of the variable resistance material in the region between the device electrodes. Because of the multi-element nature of most variable resistance materials and the fact that many of the constituent elements are capable of combining in multiple stoichiometric proportions to form compounds, differential migration of the constituent elements increases the likelihood of creating and stabilizing new compounds on cycling.

As segregation occurs and alternative compounds or phases form upon repeated cycling, an initially homogeneous variable resistance material progressively becomes heterogeneous and the electrical characteristics evolve. Stuck reset failure may occur if electromigration induces the segregation and formation of non-crystallizable phases or compounds. Similarly, stuck set failure may occur if the phases or compounds formed through electromigration exhibit high melting points or are incapable of quenching to an amorphous phase upon programming. Moreover, if the phases or compounds stabilized through electromigration are volatile or readily sublimed, void formation is promoted and the likelihood of open circuit failure increases.

While not wishing to be bound by theory, the instant inventors hypothesize that the bonding strength of the constituent elements of a variable resistance material is an underlying contributing factor to electromigration. Electrical programming imparts energy to a variable resistance material. The energy required to reset a phase-change material is sufficient to induce melting, which, for typical phase-change compositions, requires temperatures of several hundred degrees. If the programming energy for a particular variable resistance composition is an appreciable fraction of the bonding energy of the material, programming can lead to bond scission and fragmentation (or decomposition) of the material into smaller constituent units. Smaller constituent units are more susceptible to electric field induced migration than larger constituent units because they are less massive and more likely to have a high charge density. Compositions with weak bonding are thus expected to exhibit a greater degree of bond scission and electromigration than compositions with strong bonding.

The instant inventors accordingly reason that the effects of electromigration may be ameliorated by engineering the bonding characteristics of variable resistance materials. Among the most common variable resistance phase-change materials is the Ge—Sb—Te family of compositions. $Ge_2Sb_2Te_5$, for example, is the prototypical phase-change material. Other stoichiometric compositions include $GeSb_2Te_4$, $GeSb_4Te_7$, and $Ge_4SbTe_5$. The crystalline phase of many Ge—Sb—Te compositions includes a metastable fcc phase and a stable hexagonal phase. The crystal structures include layers of Te atoms and mixed Ge—Sb layers arranged in various configurations, where the bonding characteristics are dominated by Sb—Te bonds and Ge—Te bonds.

The strategy for increasing cycle life underlying this invention is to inhibit electromigration by strengthening the bonding of Ge—Sb—Te compositions. In one embodiment, the composition is modified through doping or substitution of Sb with As. In another embodiment, the composition is modified through doping or substitution of Ge with Si. Substitution of Sb with As is expected to replace Sb—Te bonds with As—Te bonds. The instant inventors expect As—Te bonds to be stronger than Sb—Te bonds and thus to be more resistant to scission during cycling. As a result, it is believed that the overall composition will be more robust and less susceptible to electromigration and phase segregation upon cycling. Accordingly, cycle life is expected to improve. Similarly, the instant inventors expect substitution of Ge with Si to replace expectedly weaker Ge—Te bonds with expectedly stronger Si—Te bonds and accordingly expect a similar benefit for cycle life.

Despite the reasoning underlying the instant invention, the expectation in the art is that efforts at modifying the bond strength of variable resistance materials are unpredictable and prone to provide counterproductive side effects. The ability of a phase-change material, for example, to undergo facile transformations between crystalline and amorphous phases is based on a delicate balance of the relative thermodynamic stability of the different possible crystalline, amorphous, and mixed crystalline-amorphous structural states as well as on the activation barriers and kinetics associated with phase transitions. Also, practical constraints on programming limit the range of programming energies to a relatively narrow range and suitable variable resistance materials must be capable of transforming between two or more resistance states within this range.

Incorporation of new elements into a variable resistance composition often leads to unintended consequences. A substitutional element has distinct chemical features such as atomic size, charge, electronegativity, bonding configuration, valence, and hybridization that may be incompatible with other elements in the composition or that may direct the other elements to form alternative phases or structures that are non-functional. In addition, the bond strength between elements depends on the structural configuration and chemical surroundings. The bond strength between a particular pair of elements may vary considerably from compound-to-compound, as may the relative bond strengths of different pairs of elements. Replacement of a host element with a substitutional element, for example, may lead to a variation in coordination number or covalency that results in a discontinuous change in bond strength upon substitution.

In phase-change materials, the transformation from amorphous phase to a crystalline phase necessitates a structural reorganization of the constituent elements from a disordered state to an ordered state. Structural reorganization requires mobility of the constituent elements and becomes increasingly hindered as bond strength increases. If the bonding strength is too high, the constituents lack sufficient mobility to rearrange to form an ordered crystalline state. Such structures can only exist in an amorphous state and are unable to undergo structural transformations that provide a variable resistance effect.

Even if the bonding strength permits crystallization, the rate of crystallization may be affected. The rate of crystallization is an important performance metric because it relates to the operational speed of the device. The rate of crystallization governs the speed of the transformation from the reset state to the set state of a phase-change material. As noted above, set pulses are of longer duration than reset pulses, so programming speed is limited by the set transformation. As bond strength increases, atomic mobility is expected to decrease and crystallization transformations are expected to become inhibited. As a result, the crystallization rate and set speed are expected to decrease and device programming is expected to become slower. Accordingly, the expectation in the art is that improvements in cycle life achieved by increasing bond strength come at the expense of programming speed.

Despite the uncertainty identified in the prior art, the instant inventors have unexpectedly discovered particular compositions that achieve a beneficial prolongation of cycle life while avoiding the detrimental consequences of increased bond strength. Illustrative examples of variable resistance compositions within the scope of the instant invention and the characteristics of devices that include the instant compositions are described in the following examples.

EXAMPLE 1

In this example, the fabrication of memory devices with active variable resistance materials having compositions in accordance with the instant invention is described. The variable resistance materials are phase-change materials selected from the Ge—Sb—Te family of compositions. The compositions are further doped with As. A series of samples spanning a range of As concentration were prepared. As indicated hereinabove, it is expected that As will substitute for Sb in the crystallographic structure of the material.

Figure 3:
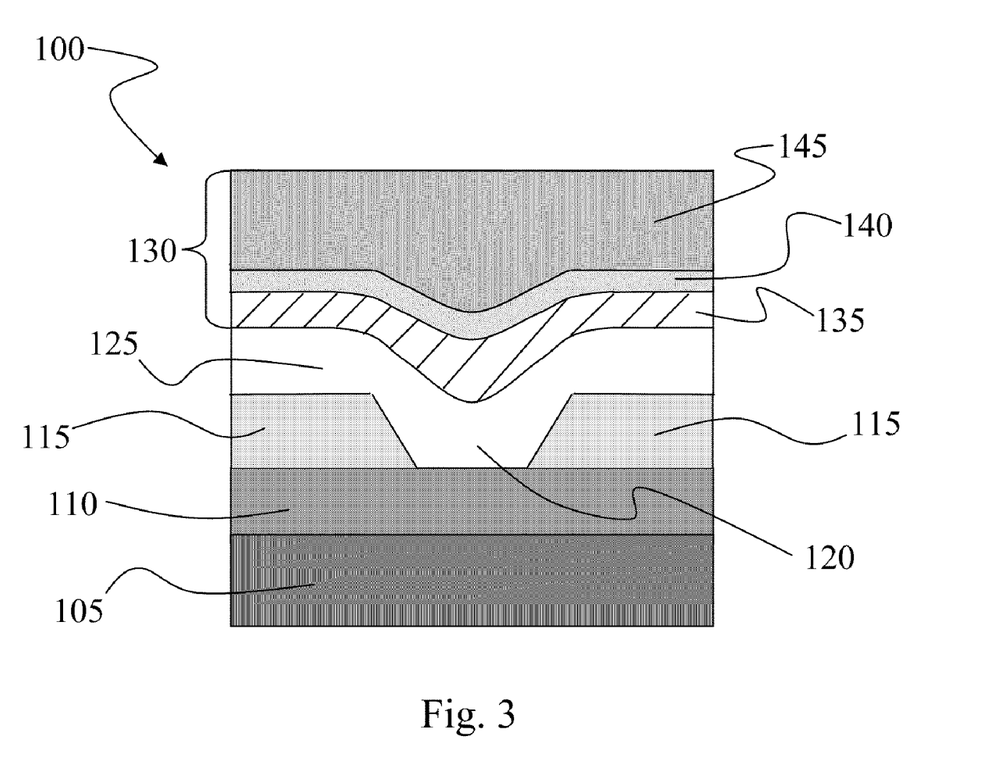
FIG. 3 depicts a variable resistance material device structure that incorporates a phase-change material.

The device structure used in the following examples is a standard two-terminal design that includes an active As-doped Ge—Sb—Te phase-change in accordance with the instant invention in electrical contact with upper and lower electrodes. The device structure is schematically illustrated in FIG. 3. Device 100 includes substrate 105, lower electrode 110, and dielectric 115. Dielectric 115 included opening 120 in which phase-change material 125 was deposited. Upper electrode 130 was formed over phase-change material 125 and included carbon layer 135, Ti layer 140, and TiN layer 145. The thicknesses of carbon layer 135, Ti layer 140, and TiN layer 145 were ~370 Å, ~20 Å, and ~400 Å, respectively. Lower electrode 110 was formed from titanium aluminum nitride (TiAlN). Dielectric 115 had a thickness of ~500 Å and was formed as an oxide. The lateral dimension of opening 120 at the interface with lower electrode 110 was approximately 90 nm.

A series of devices using various compositions for phase-change material 125 were prepared. Phase-change material 125 was prepared by a co-sputtering process utilizing targets of $Ge_2Sb_2Te_5$, Sb, and $As_2Sb_3$. The relative proportions of Ge, Sb, Te, and As in the sputtered materials were varied by varying the sputtering rates of each of the targets. Devices of the type shown in FIG. 3 were fabricated that included each of the phase-change compositions listed in the table below. Several devices for each composition were fabricated and used in the tests described in Examples 2-4 hereinbelow.

| Device | Atomic Concentration (%) | | | |
|---|---|---|---|---|
| Designation | Ge | Sb | Te | As |
| Ci1415 | 11.1 | 61.1 | 27.8 | 0.0 |
| Ci1416 | 11.1 | 59.1 | 27.8 | 2.0 |
| Ci1418 | 11.1 | 56.1 | 27.8 | 5.0 |
| Ci1417 | 11.1 | 51.1 | 27.8 | 10.0 |
| Ci1419 | 11.1 | 41.1 | 27.8 | 20.0 |
| Ci1420 | 8.9 | 68.9 | 22.2 | 0.0 |
| Ci1421 | 8.9 | 66.9 | 22.2 | 2.0 |
| Ci1422 | 8.9 | 64.1 | 22.2 | 4.8 |
| Ci1423 | 8.9 | 58.9 | 22.2 | 10.0 |
| Ci1424 | 8.9 | 48.9 | 22.2 | 20.0 |

EXAMPLE 2

In this example, the R-I (resistance vs. current) characteristics of devices Ci1415 and Ci1418 described in Example 1 are summarized. The R-I measurements were performed by applying a series of voltage pulses of increasing amplitude between upper electrode 130 and lower electrode 110. The initial voltage pulse had an amplitude of ~0.1V and each successive pulse was increased in amplitude by ~0.1V up to a maximum voltage of ~4.1V. The voltage pulses had a duration of 100 ns. While each voltage pulse was applied, the current passing through the device was measured. After each voltage pulse was applied, the resistance of the device was measured. In this way, a current and resistance was obtained for each voltage pulse and plotted as a point on the R-I curve. The process was repeated over several cycles of operation to obtain a series of R-I curves that showed how the device characteristics evolved upon cycling.

Figure 4:
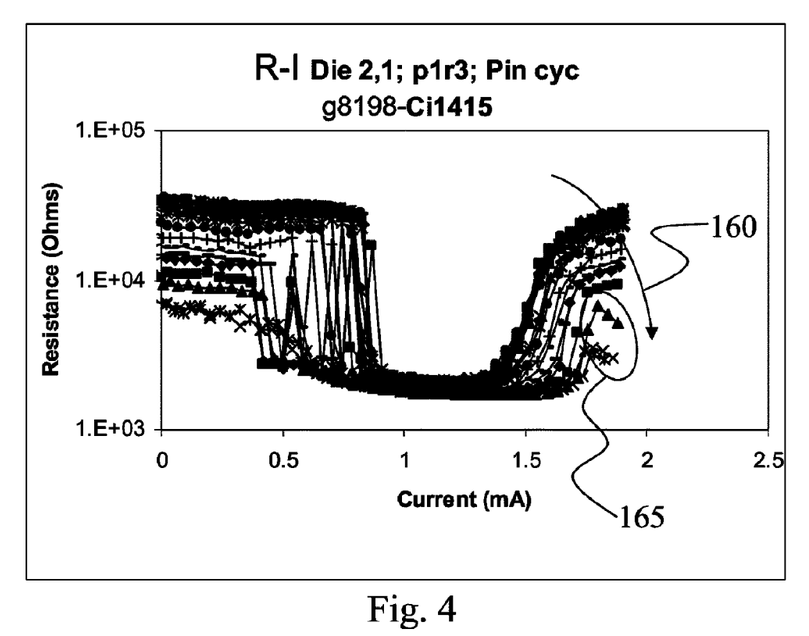
FIG. 4 shows the R-I characteristics of a variable resistance phase-change memory device that utilizes $Ge_{11.1}Sb_{61.1}Te_{27.8}$ as the active material.

A typical R-I plot is presented in FIG. 4. FIG. 4 shows the R-I characteristics over several cycles of operation for device Ci1415, which utilized $Ge_{11.1}Sb_{6.11}Te_{27.8}$ as the active phase-change material. The R-I response showed well resolved set and reset transformations. The set transformation occurred at currents of ~0.9 mA or below and the increase in current leading to the reset transformation began at currents of ~1.4 mA. The device resistance in the set state was ~2 kΩ and was consistent over multiple cycles of operation. The device resistance in the reset state was ~32 kΩ for the first ~1000 cycles of operation and progressively degraded upon further cycling. The reset resistance of the device was ~25.8 kΩ after $10^4$ cycles, ~16.2 kΩ after $10^5$ cycles, ~10.5 kΩ after $10^6$ cycles, and ~7 kΩ after $10^7$ cycles. The degradation of reset resistance upon cycling is generally indicated by arrow 160 in FIG. 4.

The degradation in reset resistance was irreversible and indicates incipient failure of the device. The cycling data indicate that the device is progressing toward a stuck set condition in which it is no longer possible to reset the device. Oval 165 in FIG. 4 marks the resistance data observed at high currents for the high cycle number portion of the data. Accompanying the degradation of reset resistance was a migration of reset current to higher values. At low cycle numbers, the resistance increase leading to the reset state initiated at currents of about ~1.4 mA and at high cycle numbers, currents of about ~1.7 mA were required. Reset current migration in the direction of increasing current is consistent with progress toward a stuck set mode of device failure.

The endurance (cycle life) characteristics of device Ci1415 ($Ge_{11.1}Sb_{61.1}Te_{27.8}$) were directly examined in a separate test. In the endurance test, the device was repeatedly cycled back and forth between the set state and reset state by applying an alternating series of set pulses and reset pulses. The voltage and amplitude of the set and reset pulses were adjusted to insure that the device was transformed into the set and reset regimes, respectively, indicated by the R-I data. The set and reset pulses included a 3 ns leading edge and a 3 ns trailing edge. The resistance of the device was measured after each pulse. Each cycle of operation included one set pulse and one reset pulse. Set and reset resistances were obtained for each cycle of operation.

Figure 5:
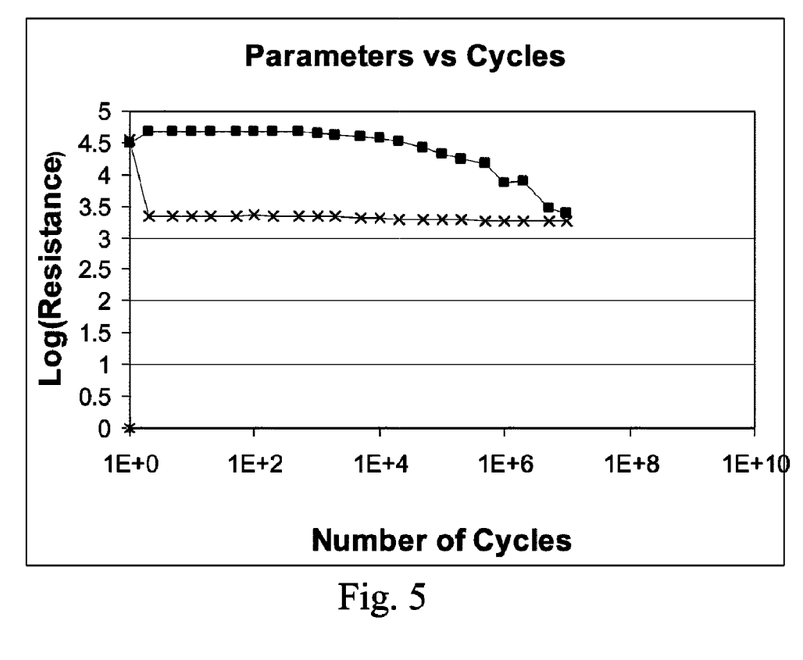
FIG. 5 shows the endurance (cycle life) characteristics of a variable resistance phase-change memory device that utilizes $Ge_{11.1}Sb_{61.1}Te_{27.8}$ as the active material.

The results of the endurance test are plotted in FIG. 5. The set and reset resistances of the device are plotted as a function of cycle number. The resistance values are plotted on a log scale, where resistance in units of ohms was used. The set resistance is denoted with the symbol "x" and the reset resistance is denoted with the symbol "■". The data indicate that the set resistance remained stable at ~2 kΩ upon cycling, while the reset resistance exhibited a progressive deterioration from a value of ~48 kΩ at low cycle number beginning at a cycle number of ~5×$10^5$ cycles. After ~$10^7$ cycles, the reset resistance had decreased to a value of ~2.5 kΩ. The endurance data indicate that the reset resistance is approaching the set resistance and that the device is progressing toward a stuck set failure condition.

Figure 6:
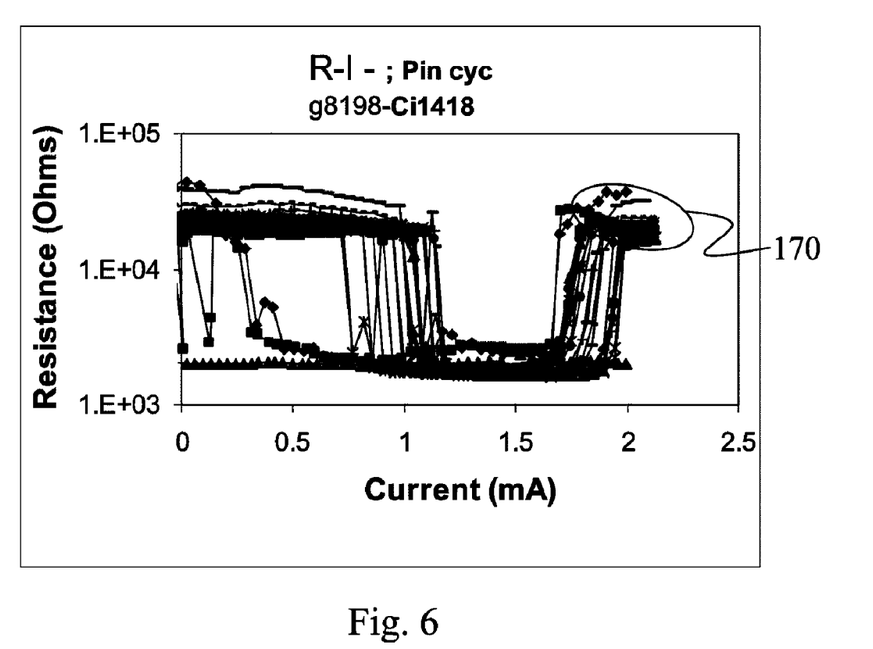
FIG. 6 shows the R-I characteristics of a variable resistance phase-change memory device that utilizes $Ge_{11.1}Sb_{56.1}Te_{27.8}As_{5.0}$ as the active material.

FIG. 6 shows the R-I characteristics over several cycles of operation for device Ci1418, which utilized $Ge_{11.1}Sb_{56.1}Te_{27.8}As_{5.0}$ as the active phase-change material. Relative the active material used in device Ci1415, the active material used in device Ci1418 included a substitution of 5% of the Sb content with As. The R-I response of device Ci1418 showed well resolved set and reset transformations. The set transformation occurred at currents of ~1.1 mA or below and the increase in current leading to the reset transformation began at currents of ~1.7 mA. The device resistance in the set state was ~1.8 kΩ and was consistent over multiple cycles of operation. The device resistance in the reset state was ~22 kΩ for the first ~$10^5$ cycles of operation and varied only slightly upon further cycling. The reset resistance of the device was ~17.1 kΩ after $10^6$ cycles and ~19 kΩ after $10^7$ cycles. The variation of reset resistance upon cycling is generally indicated by oval 170 in FIG. 6. The R-I data for device Ci1418 indicate that inclusion of 5% As in the composition prevented the sharp degradation in reset resistance observed for device Ci1419 and also inhibited migration of the reset current. The data indicate that inclusion of 5% As provided more stable operation over a larger number of cycles.

The endurance (cycle life) characteristics of device Ci1418 ($Ge_{11.1}Sb_{56.1}Te_{27.8}As_{5.0}$) were directly examined in a separate test. In the endurance test, the device was repeatedly cycled back and forth between the set state and reset state by applying an alternating series of set pulses and reset pulses as described previously. The resistance of the device was measured after each pulse. Each cycle of operation included one set pulse and one reset pulse. Set and reset resistances were obtained for each cycle of operation.

Figure 7:
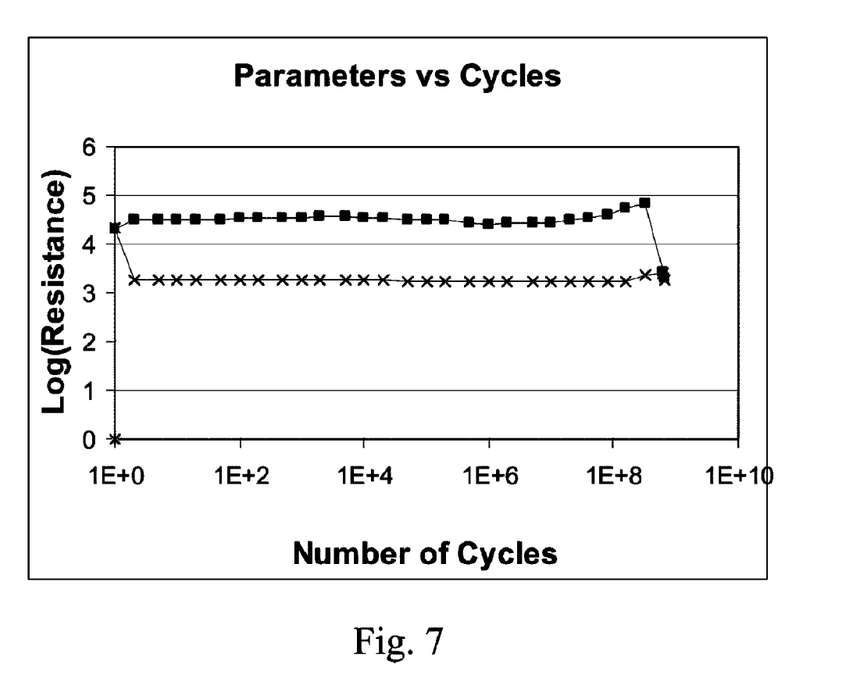
FIG. 7 shows the endurance (cycle life) characteristics of a variable resistance phase-change memory device that utilizes $Ge_{11.1}Sb_{56.1}Te_{27.8}As_{5.0}$ as the active material.

The results of the endurance test are plotted in FIG. 7. The set and reset resistances of the device are plotted as a function of cycle number. The resistance values are plotted on a log scale, where resistance in units of ohms was used. The set resistance is denoted with the symbol "x" and the reset resistance is denoted with the symbol "■". The data indicate that the set resistance remained stable at ~1.8 kΩ upon cycling up to over $10^8$ cycles. The reset resistance remained stable at ~30 kΩ up to ~$10^7$ cycles and then exhibited a gradual increase upon further cycling. The endurance data for device Ci1418 indicate that the useful life of the device extends to ~$6.4 \times 10^8$ cycles of operation. The incorporation of 5% As led to a significant improvement in cycle life.

R-I and endurance testing were also completed for devices Ci1416, Ci1417, and Ci1419. The active material in each of these devices also included 11% Ge and 27.8% Te. Each material included a partial substitution of Sb with As, where the concentration of As was varied. The R-I data (not shown) for each of the devices exhibited clearly defined set and reset transformations. The cycle life results are summarized in the table below:

| Device | Active Material | Cycle Life | Failure Mode |
|---|---|---|---|
| Ci1415 | $Ge_{11.1}Sb_{61.1}Te_{27.8}$ | $5.0 \times 10^5$ | Stuck Set |
| Ci1416 | $Ge_{11.1}Sb_{59.1}Te_{27.8}As_{2.0}$ | $8.0 \times 10^7$ | Stuck Set |
| Ci1418 | $Ge_{11.1}Sb_{56.1}Te_{27.8}As_{5.0}$ | $6.4 \times 10^8$ | Stuck Set |
| Ci1417 | $Ge_{11.1}Sb_{51.1}Te_{27.8}As_{10.0}$ | $5.0 \times 10^6$ | Stuck Reset |
| Ci1419 | $Ge_{11.1}Sb_{41.1}Te_{27.8}As_{20.0}$ | $2.0 \times 10^6$ | Stuck Reset |

The cycle life data indicate that incorporation of As into the composition led to an increase in cycle life up to an As concentration of 5% and that concentrations of As above 5% resulted in a decrease in cycle life. The data also indicate that the mode of failure changed from stuck set at low As concentrations to stuck reset at high As concentrations. The stuck reset mode of failure indicates that active materials with higher concentrations of As are unable to crystallize after a certain number of operating cycles and is consistent with an overall increase in bonding strength in the material due to the presence of As. As indicated hereinabove, crystallization requires rearrangements of atomic constituents to form an ordered structure. The higher bonding strength of As relative to Sb disfavors crystallization and when the As concentration reaches a critical level, the ability of the material to crystallize is inhibited.

EXAMPLE 3

In this example, the R-I and endurance characteristics of devices Ci1420, Ci1421, Ci1422, Ci1423, and Ci1424 are presented. Each of these devices included an active material containing 8.9% Ge and 22.2% Te. The balance of the composition was Sb or a combination of Sb and As, where the relative concentrations of Sb and As varied over the series of devices. The technique for obtaining R-I and endurance data is as described hereinabove in Example 2.

Figure 8:
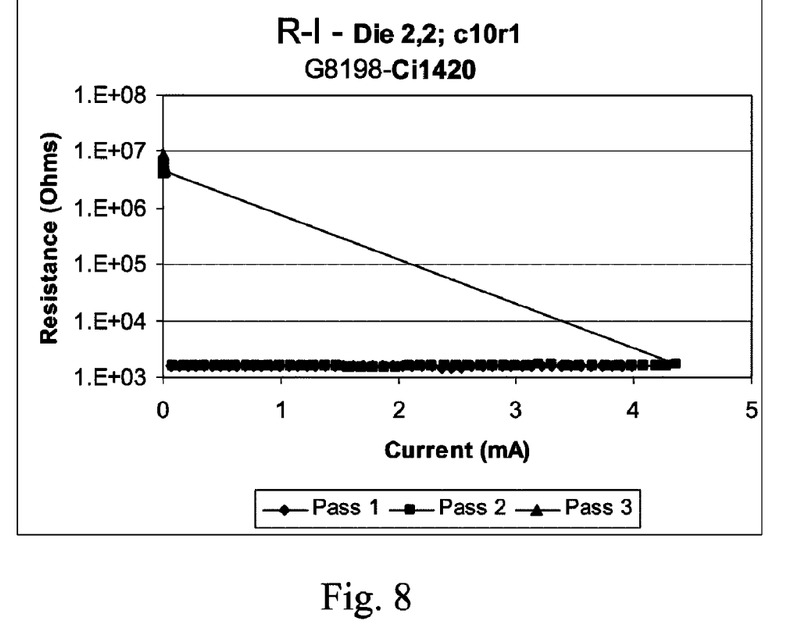
FIG. 8 shows the R-I characteristics of a variable resistance phase-change memory device that utilizes $Ge_{8.9}Sb_{68.9}Te_{22.2}$ as the active material.
Figure 9:
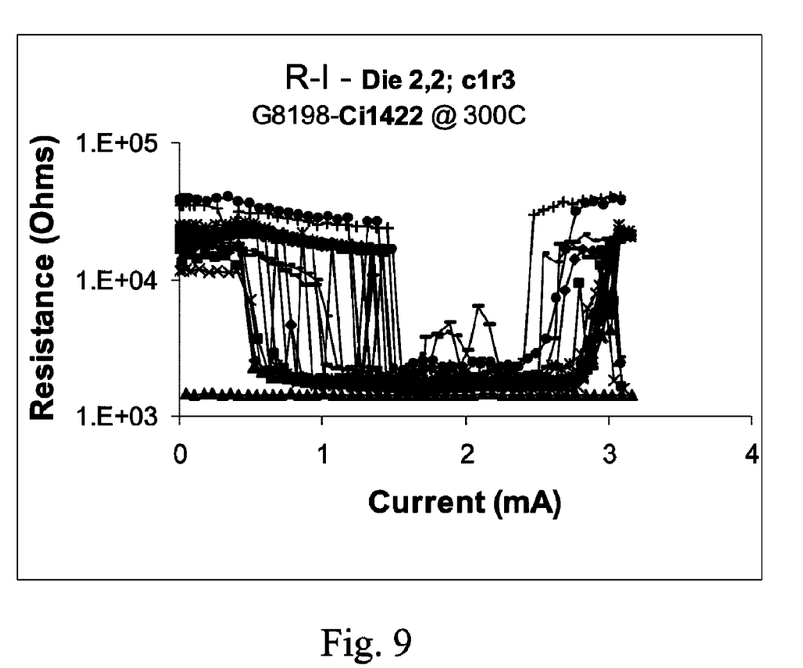
FIG. 9 shows the R-I characteristics of a variable resistance phase-change memory device that utilizes $Ge_{8.9}Sb_{64.1}Te_{22.2}As_{4.8}$ as the active material.

FIG. 8 shows data obtained in an attempt to establish the set and reset characteristics of device Ci1420, which included $Ge_{8.9}Sb_{68.9}Te_{22.2}$ as the active material. The data indicated an inability to induce a transformation of the device between set and reset states. Instead, the device exhibited a resistance of ~1.6 kΩ, even at currents above 4 mA and appeared to reside in a stuck set state from inception. The remaining devices of this example included As substitution for Sb and each displayed set and reset transformations. FIG. 9 shows the R-I characteristics for device Ci1422 ($Ge_{8.9}Sb_{64.1}Te_{22.2}As_{4.8}$) over multiple cycles of operation and is representative of the results for the As-containing devices of this example.

The cycle life results for the devices investigated for this example are summarized below:

| Device | Active Material | Cycle Life | Failure Mode |
|---|---|---|---|
| Ci1420 | $Ge_{8.9}Sb_{68.9}Te_{22.2}$ | Did not cycle | |
| Ci1421 | $Ge_{8.9}Sb_{66.9}Te_{22.2}As_{2.0}$ | $7.5 \times 10^5$ | Stuck Set |
| Ci1422 | $Ge_{8.9}Sb_{64.1}Te_{22.2}As_{4.8}$ | $2.0 \times 10^6$ | Stuck Set |
| Ci1423 | $Ge_{8.9}Sb_{58.9}Te_{22.2}As_{10.0}$ | $3.2 \times 10^8$ | Stuck Set |
| Ci1424 | $Ge_{8.9}Sb_{48.9}Te_{22.2}As_{20.0}$ | 10 | |

The cycle life data indicate that incorporation of As into the composition led to an increase in cycle life up to an As concentration of 10% and that concentrations of As above 10% resulted in a decrease in cycle life. The data also indicate that the mode of failure was stuck set and that the devices were essentially non-functional at the low (0%) and high (20%) As concentration limits considered in this example.

EXAMPLE 4

In this example, the set speed characteristics of the devices described in Examples 1-3 are presented. The set speed is a measure of the rate of crystallization of the active material of the device and provides an indication of the expected programming speed of the device. As indicated hereinabove, the crystallization process is slower than the amorphization process. As a result, a transformation of the device to its set state is slower than a transformation of the device to its reset state. Accordingly, the set transformation is a limiting factor in determining the operational programming speed of the device.

The set speed was measured using a set sweep technique. In the set sweep technique, the device was first reset with voltage pulse having an amplitude sufficient to melt the active material and a falltime sufficiently fast to prevent crystallization (steep trailing edge). The device was then subjected to a "set" pulse having a fast risetime (steep leading edge), approximately the same amplitude as the reset pulse, and a slow falltime (gradual trailing edge). After application of the "set" pulse, the resistance of the device was measured to determine whether the device had set. If the "set" pulse reduced the device resistance below a target resistance, the device was deemed to have set and the procedure was repeated with a "set" pulse having a shorter falltime. The procedure was continued in this manner using "set" pulses having progressively faster falltimes in an effort to identify the minimum falltime that is capable of setting the device.

Figure 10:
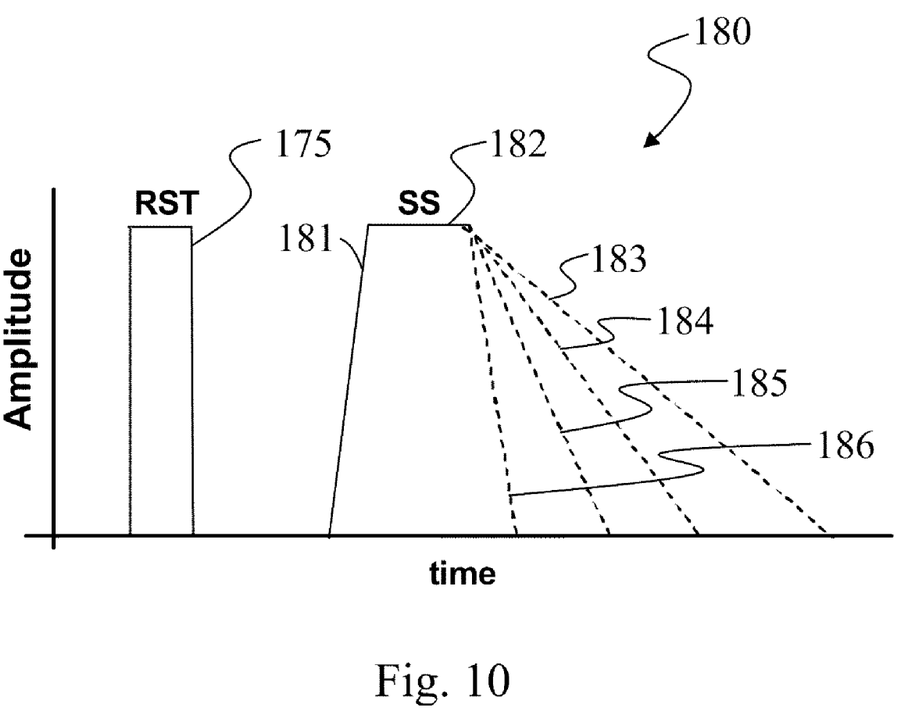
FIG. 10 is a schematic depiction of pulses employed in the set sweep method of measuring crystallization speed.

FIG. 10 depicts the pulse strategy employed in the set sweep technique. The device is first transformed to an initial reset state using reset pulse 175. The series of set sweep pulses is generally indicated at 180. Each of the set sweep pulses included a steep leading edge 181 and an amplitude plateau that corresponded to the amplitude (current or voltage) of reset pulse 175. The first of the series of set sweep pulse has slow trailing edge (long falltime) 182. The long falltime promotes crystallization and is expected to set the device. After the first of the set sweep pulses is applied the device resistance is measured and the device is reset with pulse 175. The second of the series of set sweep pulses, having trailing edge 183 with a shorter falltime than trailing edge 182, is then applied and the procedure is repeated until the falltime is sufficiently short to allow the device to crystallize sufficiently to cause the device resistance to decrease to below a threshold resistance value.

As noted hereinabove, crystallization requires the active material to exist at a temperature between the crystallization temperature and melting temperature for a sufficiently long period of time to permit the structural rearrangements necessary to form an ordered structure from the melt phase. The set sweep technique uses the falltime of the pulse to regulate the rate of cooling of the active material. The amplitude of each set sweep pulse is sufficient to melt the active material. Set sweep pulses with long falltimes insure that the device exists at a temperature that permits crystallization for a sufficient time. Set sweep pulses with short falltimes cause the active material to cool quickly and prevent it from existing at a temperature that permits crystallization for a sufficient time. Instead, the active material quenches to a state having a substantial amorphous content. The objective of the set sweep technique is to apply a series of set sweep pulses that span a range of falltimes that allow for a determination of the shortest falltime that enables the device to set. This time is a measure of the crystallization speed of the material and is used in this example as a metric for device speed. This time is referred to herein as the time-to-set or set speed of the device. A short time-to-set indicates a fast set speed.

Set speed results were obtained for the devices described in Example 1 hereinabove for two different reset (and set sweep) pulse amplitudes. The R-I characteristics of the devices indicated that the resistance increased rapidly as the device approached the reset state. At or near the reset state, the slope of the R-I response curve decreased and the R-I response leveled off. Set speeds in this example were determined with a lower amplitude reset pulse that was designed to transform the device to or near the onset of the reset regime observed in the R-I response curve and a higher amplitude reset pulse that was designed to transform the device to a point within and beyond the onset of the reset regime. The amplitude of the higher amplitude pulse was typically about 20% greater than the amplitude of the lower amplitude pulse.

The set speed results for the devices are summarized in the table below:

| Device | Active Material | Set Speed (ns) - Low Amplitude | Set Speed (ns) - High Amplitude |
|---|---|---|---|
| Ci1415 | $Ge_{11.1}Sb_{61.1}Te_{27.8}$ | 30 | 15 |
| Ci1416 | $Ge_{11.1}Sb_{59.1}Te_{27.8}As_{2.0}$ | 15 | 15 |
| Ci1418 | $Ge_{11.1}Sb_{56.1}Te_{27.8}As_{5.0}$ | 25 | 13 |
| Ci1417 | $Ge_{11.1}Sb_{51.1}Te_{27.8}As_{10.0}$ | 54 | 136 |
| Ci1419 | $Ge_{11.1}Sb_{41.1}Te_{27.8}As_{20.0}$ | 18 | 238 |
| Ci1421 | $Ge_{8.9}Sb_{66.9}Te_{22.2}As_{2.0}$ | 24 | 22 |
| Ci1422 | $Ge_{8.9}Sb_{64.1}Te_{22.2}As_{4.8}$ | 10 | 10 |
| Ci1423 | $Ge_{8.9}Sb_{58.9}Te_{22.2}As_{10.0}$ | 62 | 59 |
| Ci1424 | $Ge_{8.9}Sb_{48.9}Te_{22.2}As_{20.0}$ | 330 | 40 |

The set speed data indicate inclusion of As at levels of up to ~5% does not inhibit programming speed and in several instances (e.g. device Ci1416 at low reset pulse amplitude and device Ci1422 at low and high reset pulse amplitudes) was observed to improve programming speed. This observation is surprising because replacement of Sb with As is expected to increase the bond strength of the material. As a result, As substitution for Sb would a priori be expected to inhibit crystallization and increase the time required to set the device. Moreover, Sb is generally regarded as a fast crystallizing element and its inclusion in a composition often leads to enhanced crystallization speed. Accordingly, a reduction or constancy of set speed with reduced Sb concentration is counterintuitive.

Over the series of devices Ci1421, Ci1422, Ci1423, and Ci1424, the set speed remained fast throughout full range of As concentrations when high amplitude reset pulses were used. A similar result was observed over the series of devices Ci1415, Ci1416, Ci1417, Ci1418, and Ci1419 for low amplitude reset pulses. Devices Ci1417 and Ci1419 exhibited a marked increase in the time required to set (a decrease in set speed) for high reset pulse amplitudes. A similar effect was observed at low reset pulse amplitudes for device Ci1424.

The results of the foregoing examples indicate that incorporation of As into the composition of Ge—Sb—Te variable resistance phase-change materials at intermediate concentrations provides the benefit of increased device endurance (cycle life) without sacrificing device speed. The instant variable resistance materials provide both long cycle life and fast operational speeds. The expectation in the prior art has been that a trade off exists between cycle life and operational speed. Extended cycle life requires a stable, robust material that is capable of undergoing multiple iterations back and forth between phases. Each phase transformation entails subjecting the material to conditions that produce high temperatures and promote degradation of the material through bond scission, decomposition, reaction etc. To counteract degradation, it is widely believed in the art that high bonding strengths are necessary. High bonding strengths improve the stability of the material and inhibit degradation.

High bonding strengths, however, have generally been viewed as inhibiting crystallization. As noted hereinabove, crystallization requires atomic rearrangements from an amorphous phase. Such rearrangements are inhibited if the bond strength in the amorphous phase is high. As a result, high bond strength has been regarded as detrimental to programming speed. Notwithstanding the expectations of the prior art, the instant compositions exhibit both high endurance and fast programming speeds.

Based on the data presented herein, As substitution for Sb in Ge—Sb—Te alloys has been demonstrated to provide a performance enhancement in variable resistance memory applications. In one embodiment, the variable resistance material has an atomic concentration of Ge in the range from 7%-13%, an atomic concentration of Sb in the range from 50%-70%, an atomic concentration of Te in the range from 20%-30%, and an atomic concentration of As in the range from 2%-15%. In a second embodiment, the variable resistance material has an atomic concentration of Ge in the range from 7%-13%, an atomic concentration of Sb in the range from 50%-70%, an atomic concentration of Te in the range from 20%-30%, and an atomic concentration of As in the range from 5%-10%. In a third embodiment, the variable resistance material has an atomic concentration of Ge in the range from 7%-13%, an atomic concentration of Sb in the range from 55%-65%, an atomic concentration of Te in the range from 20%-30%, and an atomic concentration of As in the range from 2%-15%. In a fourth embodiment, the variable resistance material has an atomic concentration of Ge in the range from 7%-13%, an atomic concentration of Sb in the range from 55%-65%, an atomic concentration of Te in the range from 20%-30%, and an atomic concentration of As in the range from 5%-10%.

In a fifth embodiment, the variable resistance material has an atomic concentration of Ge in the range from 8%-12%, an atomic concentration of Sb in the range from 50%-70%, an atomic concentration of Te in the range from 20%-30%, and an atomic concentration of As in the range from 2%-15%. In a sixth embodiment, the variable resistance material has an atomic concentration of Ge in the range from 8%-12%, an atomic concentration of Sb in the range from 50%-70%, an atomic concentration of Te in the range from 20%-30%, and an atomic concentration of As in the range from 5%-10%. In a seventh embodiment, the variable resistance material has an atomic concentration of Ge in the range from 8%-12%, an atomic concentration of Sb in the range from 55%-65%, an atomic concentration of Te in the range from 20%-30%, and an atomic concentration of As in the range from 2%-15%. In an eighth embodiment, the variable resistance material has an atomic concentration of Ge in the range from 8%-12%, an atomic concentrations of Sb in the range from 55%-65%, an atomic concentration of Te in the range from 20%-30%, and an atomic concentration of As in the range from 5%-10%.

In a ninth embodiment, the variable resistance material has an atomic concentration of Ge in the range from 9%-11%, an atomic concentration of Sb in the range from 50%-70%, an atomic concentration of Te in the range from 20%-30%, and an atomic concentration of As in the range from 2%-15%. In a tenth embodiment, the variable resistance material has an atomic concentration of Ge in the range from 9%-11%, an atomic concentration of Sb in the range from 50%-70%, an atomic concentration of Te in the range from 20%-30%, and an atomic concentration of As in the range from 5%-10%. In an eleventh embodiment, the variable resistance material has an atomic concentration of Ge in the range from 9%-11%, an atomic concentration of Sb in the range from 55%-65%, an atomic concentration of Te in the range from 20%-30%, and an atomic concentration of As in the range from 2%-15%. In a twelfth embodiment, the variable resistance material has an atomic concentration of Ge in the range from 9%-11%, an atomic concentration of Sb in the range from 55%-65%, an atomic concentration of Te in the range from 20%-30%, and an atomic concentration of As in the range from 5%-10%.

In still other embodiments, the atomic concentration of Te is in the range from 22%-28% in each of the foregoing embodiments.

Those skilled in the art will appreciate that the methods and designs described above have additional applications and that the relevant applications are not limited to those specifically recited above. Also, the present invention may be embodied in other specific forms without departing from the essential characteristics as described herein. The embodiments described above are to be considered in all respects as illustrative only and not restrictive in any manner.

We claim:

1. A variable resistance material comprising Ge, Sb, Te, and As, wherein the atomic concentration of Ge is in the range from 7%-13%, the atomic concentration of Sb is in the range from 50%-70%, the atomic concentration of Te is in the range from 20%-30%, and the atomic concentration of As is in the range from 2%-15%.

2. The variable resistance material of claim 1, wherein the atomic concentration of As is in the range from 5-10%.

3. The variable resistance material of claim 1, wherein the atomic concentration of Te is in the range from 22%-28%.

4. The variable resistance material of claim 3, wherein the atomic concentration of As is in the range from 5%-10%.

5. The variable resistance material of claim 1, wherein the atomic concentration of Sb is in the range from 55%-65%.

6. The variable resistance material of claim 5, wherein the atomic concentration of Te is in the range from 22%-28%.

7. The variable resistance material of claim 6, wherein the atomic concentration of As is in the range from 5%-10%.

8. The variable resistance material of claim 5, wherein the atomic concentration of As is in the range from 5%-10%.

9. The variable resistance material of claim 1, wherein the atomic concentration of Ge is in the range from 8%-12%.

10. The variable resistance material of claim 9, wherein the atomic concentration of As is in the range from 5-10%.

11. The variable resistance material of claim 9, wherein the atomic concentration of Te is in the range from 22%-28%.

12. The variable resistance material of claim 11, wherein the atomic concentration of As is in the range from 5%-10%.

13. The variable resistance material of claim 9, wherein the atomic concentration of Sb is in the range from 55%-65%.

14. The variable resistance material of claim 13, wherein the atomic concentration of Te is in the range from 22%-28%.

15. The variable resistance material of claim 14, wherein the atomic concentration of As is in the range from 5%-10%.

16. The variable resistance material of claim 13, wherein the atomic concentration of As is in the range from 5%-10%.

17. The variable resistance material of claim 1, wherein the atomic concentration of Ge is in the range from 9%-11%.

18. The variable resistance material of claim 17, wherein the atomic concentration of As is in the range from 5-10%.

19. The variable resistance material of claim 17, wherein the atomic concentration of Te is in the range from 22%-28%.

20. The variable resistance material of claim 19, wherein the atomic concentration of As is in the range from 5%-10%.

21. The variable resistance material of claim 17, wherein the atomic concentration of Sb is in the range from 55%-65%.

22. The variable resistance material of claim 21, wherein the atomic concentration of Te is in the range from 22%-28%.

23. The variable resistance material of claim 22, wherein the atomic concentration of As is in the range from 5%-10%.

24. The variable resistance material of claim 21, wherein the atomic concentration of As is in the range from 5%-10%.

25. The variable resistance material of claim 1, wherein said material is a phase-change material.

26. The variable resistance material of claim 25, wherein said phase-change material is electrically stimulable.

27. An electronic device comprising the variable resistance material of claim 1, said electronic device including a first electrode in electrical communication with said variable resistance material and a second electrode in electrical communication with said variable resistance material.

* * * * *